US012701880B2

(12) United States Patent
Jung et al.

(10) Patent No.: US 12,701,880 B2
(45) Date of Patent: Aug. 4, 2026

(54) DISPLAY APPARATUS FOR PREVENTING NON-UNIFORMITY OF LUMINANCE

(71) Applicant: LG Display Co., Ltd, Seoul (KR)

(72) Inventors: Yeoun-jei Jung, Paju-si (KR);
Dong-Hun Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 440 days.

(21) Appl. No.: 18/324,046

(22) Filed: May 25, 2023

(65) Prior Publication Data

US 2024/0206253 A1      Jun. 20, 2024

(30) Foreign Application Priority Data

Dec. 15, 2022    (KR) ........................ 10-2022-0175958

(51) Int. Cl.
    *H10K 59/131*        (2023.01)
    *G09G 3/3233*        (2016.01)
(52) U.S. Cl.
    CPC ......... *H10K 59/131* (2023.02); *G09G 3/3233* (2013.01); *G09G 2300/0842* (2013.01)

(58) Field of Classification Search
    CPC ....... H10H 29/49; H10H 29/39; H10K 59/131
    See application file for complete search history.

(56) References Cited

U.S. PATENT DOCUMENTS

| | | | |
|---|---|---|---|
| 9,397,150 B2 | 7/2016 | Kim et al. | |
| 11,449,162 B2 * | 9/2022 | Lee .................. | G06F 1/1686 |
| 2006/0040132 A1 * | 2/2006 | Liao .................. | H10K 50/125 |
| | | | 313/506 |
| 2015/0187862 A1 | 7/2015 | Kim et al. | |
| 2019/0341439 A1 * | 11/2019 | Choi .................. | H10K 59/131 |
| 2020/0326804 A1 * | 10/2020 | Oh .................. | G06F 3/0412 |
| 2024/0114737 A1 * | 4/2024 | Yue .................. | H10K 59/131 |

FOREIGN PATENT DOCUMENTS

| | | |
|---|---|---|
| KR | 10-2015-0075633 A | 7/2015 |
| KR | 10-2019-0128030 A | 11/2019 |

* cited by examiner

*Primary Examiner* — Eva Y Montalvo
(74) *Attorney, Agent, or Firm* — Fenwick & West LLP

(57)        ABSTRACT

A display apparatus comprises a display panel having a display area configured to display an image and a non-display area around the display area, a low potential voltage line in the non-display area, and a high potential voltage line between the display area and the low potential voltage line.

13 Claims, 9 Drawing Sheets

DISPLAY APPARATUS FOR PREVENTING NON-UNIFORMITY OF LUMINANCE

CROSS-REFERENCE TO RELATED APPLICATION

This application claims priority to and the benefit of Republic of Korea Patent Application No. 10-2022-0175958, filed on Dec. 15, 2022, the contents of which are incorporated herein by reference in their entirety.

BACKGROUND

1. Technical Field

This disclosure relates to a display apparatus capable of preventing non-uniformity of luminance due to increase of the luminance at a lower end portion of a screen.

2. Discussion of the Related Art

An organic light emitting display apparatus is mainly used as a display apparatus because of high response speed, high luminance, and good viewing angle.

In the organic light emitting display apparatus, however, when the driving voltage is raised the potential difference between the high potential voltage and the low potential voltage is also raised. The amount of the electric charge accumulated in a substrate or a lower layer is increased by the potential difference and an induced charge is generated in an adjacent region by the increase in the amount of charge. Accordingly, the luminance of an adjacent region (e.g., the lower portion of the screen) is higher than that of other regions due to the induced charge, resulting in uneven luminance on the screen.

SUMMARY

The present disclosure provides a display apparatus capable of preventing or at least reducing an increase of luminance at the lower end portion of display area by reducing the effect of potential difference by arranging a low potential voltage line and a high potential voltage line in parallel in a non-display area at the lower end portion of the display area.

In some embodiments, a display apparatus according to one embodiment comprises a display panel having a display area for displaying an image and a non-display area around the display area, a low potential voltage line disposed in the non-display area, and a high potential voltage line disposed between the display area and the low potential voltage line.

The display panel includes at least one thin film transistor having a semiconductor pattern on a substrate in the display area, a gate insulating layer on the semiconductor pattern, a gate electrode on the gate insulating layer, an interlayer insulating layer on the gate electrode, and source and drain electrodes on the interlayer insulating layer and a light emitting device over the thin film transistor.

The high potential voltage line may include a first metal layer on the interlayer insulating layer and the low potential voltage line may include a second metal layer on the interlayer insulating layer.

An insulating layer is formed over the thin film transistor and a connection layer is formed on the insulating layer to connect the drain electrode of the thin film transistor to the light emitting device. In this structure, the high potential voltage line further includes a third metal layer on the insulating layer and the low potential voltage line further includes a fourth metal layer on the insulating layer.

The first metal layer may be electrically connected to the third metal layer and the second metal layer may be electrically connected to the fourth metal layer.

A cover layer is formed on the high potential voltage line and the low potential voltage line and may be formed in the entire area of the substrate.

The light emitting device may be formed in a tandem structure in which a plurality of organic light emitting devices are stacked in series.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
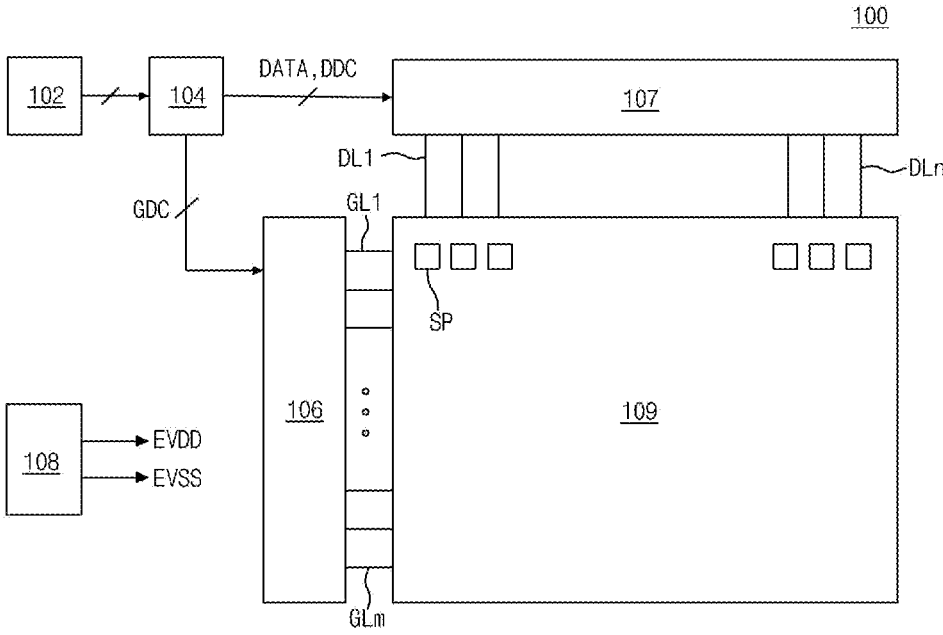
FIG. 1 is a schematic block diagram of a display apparatus according to one embodiment of the present disclosure.

Advantages and features of the present disclosure and methods for achieving them will be made clear from embodiments described in detail below with reference to the accompanying drawings. The present disclosure may, however, be implemented in many different forms and should not be construed as being limited to the embodiments set forth herein, and the embodiments are provided such that this disclosure will be thorough and complete and will fully convey the scope of the present disclosure to those skilled in the art to which the present disclosure pertains, and the present disclosure is defined only by the scope of the appended claims.

Shapes, sizes, ratios, angles, numbers, and the like disclosed in the drawings for describing the embodiments of the present disclosure are illustrative, and thus the present disclosure is not limited to the illustrated matters. The same reference numerals refer to the same components throughout this disclosure. Further, in the following description of the present disclosure, when a detailed description of a known related art is determined to unnecessarily obscure the gist of the present disclosure, the detailed description thereof will be omitted herein. When terms such as "including," "having," "comprising," and the like mentioned in this disclosure are used, other parts may be added unless the term "only" is used herein. When a component is expressed as being singular, being plural is included unless otherwise specified.

In analyzing a component, an error range is interpreted as being included even when there is no explicit description.

In describing a positional relationship, for example, when a positional relationship of two parts is described as being "on," "above," "below," "next to," or the like, unless "immediately" or "directly" is not used, one or more other parts may be located between the two parts.

In describing a temporal relationship, for example, when a temporal predecessor relationship is described as being "after," "subsequent," "next to," "prior to," or the like, unless "immediately" or "directly" is not used, cases that are not continuous may also be included.

Although the terms first, second, and the like are used to describe various components, these components are not substantially limited by these terms. These terms are used only to distinguish one component from another component. Therefore, a first component described below may substantially be a second component within the technical spirit of the present disclosure.

In describing the components of the invention, terms such as first, second, A, B, (a), (b), etc. may be used. These terms are only for distinguishing the elements from other elements, and the essence, order, or number of the elements are not limited by the terms. When it is described that a component is "connected" "coupled" or "connected" to another component, the component may be directly connected or connected to the other component, but indirectly without specifically stated It should be understood that other components may be "interposed" between each component that is connected or can be connected.

As used herein, the term "apparatus" may include a display apparatus such as a liquid crystal module (LCM) including a display panel and a driving unit for driving the display panel, and an organic light emitting display module (OLED module). Further, the term "apparatus" may further include a notebook computer, a television, a computer monitor, a vehicle electric apparatus including an apparatus for a vehicle or other type of vehicle, and a set electronic apparatus or a set apparatus such as a mobile electronic apparatus of a smart phone or an electronic pad, etc., which are a finished product (complete product or final product) including LCM and OLED module.

Accordingly, the apparatus in the invention may include the display apparatus itself such as the LCM, the OLED module, etc., and the application product including the LCM, the OLED module, or the like, or the set apparatus, which is the apparatus for end users.

Hereinafter, the disclosure will be described in detail with reference to the accompanying drawings.

Figure 2:
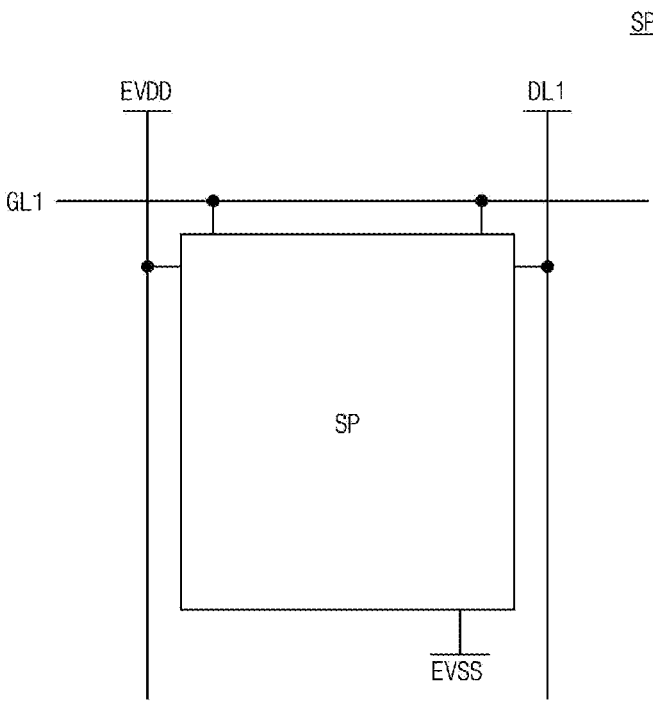
FIG. 2 is the schematic block diagram of a sub-pixel according to one embodiment of the present disclosure.

FIG. 1 is the schematic block diagram and FIG. 2 is the schematic block diagram of the sub-pixel of the organic light emitting display apparatus according to this invention.

As shown in FIG. 1, the organic light emitting display apparatus 100 includes an image processing unit 102, a timing controlling unit 104, a gate driving unit 106, a data driving unit 107, a power supplying unit 108, and a display panel 109.

The image processing unit 102 outputs image data supplied from outside and a driving signal for driving various devices. For example, the driving signal from the image processing unit 102 can include a data enable signal, a vertical synchronizing signal, a horizontal synchronizing signal, and a clock signal.

The image data and the driving signal are supplied to the timing controlling unit 104 from the image processing unit 102. The timing controlling unit 104 writes and outputs gate timing controlling signal GDC for controlling the driving timing of the gate driving unit 106 and data timing controlling signal DDC for controlling the driving timing of the data driving unit 107 (e.g., a data driver) based on the driving signal from the image processing unit 102.

The gate driving unit 106 outputs the scan signal to the display panel 109 in response to the gate timing control signal GDC supplied from the timing controlling unit 104. The gate driving unit 106 outputs the scan signal through a plurality of gate lines GL1 to GLm. In this case, the gate driving unit 106 (e.g., a gate driver) may be formed in the form of an integrated circuit (IC), but is not limited thereto. The gate driving unit 106 includes various gate driving circuits, and the gate driving circuits may be directly formed on the substrate 110. In this case, the gate driving unit 106 may be a gate-in-panel (GIP).

The data driving unit 107 outputs the data voltage to the display panel 109 in response to the data timing control signal DDC input from the timing controlling unit 104. The data driving unit 107 samples and latches the digital data signal DATA supplied from the timing controlling unit 104 to convert it into the analog data voltage based on the gamma voltage. The data driving unit 107 outputs the data voltage through the plurality of data lines DL1 to DLn. In this case, the data driving unit 107 may be mounted on the upper surface of the display panel 109 in the form of an integrated circuit (IC), but is not limited thereto.

The power supplying unit 108 outputs a high potential voltage VDD and a low potential voltage VSS etc. to supply these to the display panel 109. The high potential voltage VDD is supplied to the display panel 109 through the first power line EVDD and the low potential voltage VSS is supplied to the display panel 109 through the second power line EVSS. In this time, the voltage from the power supplying unit 108 are applied to the data driving unit 107 or the gate driving unit 106 to drive thereto.

The display panel 109 displays the image based on the data voltage from the data driving unit 108, the scan signal from the gate driving unit 106, and the power from the power supplying unit 108.

The display panel PAN includes a plurality of sub-pixels SP to display the image. The sub-pixel SP can include Red sub-pixel, Green sub-pixel, and Blue sub-pixel. Further, the sub-pixel SP can include White sub-pixel, the Red sub-pixel, the Green sub-pixel, and the Blue sub-pixel. The White sub-pixel, the Red sub-pixel, the Green sub-pixel, and the Blue sub-pixel may be formed in the same area or may be formed in different areas.

As shown in FIG. 2, one sub-pixel SP may be connected to the gate line GL1, the data line DL1, the first power line EVDD, and the second power line EVSS. The number of transistors, capacitors and the driving method of the sub-pixel SP are determined according to the circuit configuration. For example, the one sub-pixel SP may include two transistors and one capacitor 2T1C, but is not limited thereto, and the one sub-pixel SP may include 3T1C, 4T1C, 5T1C, 6T1C, 7T1C, 3T2C, 4T2C, 5T2C, 6T2C, 7T2, and 8T2C.

Figure 3:
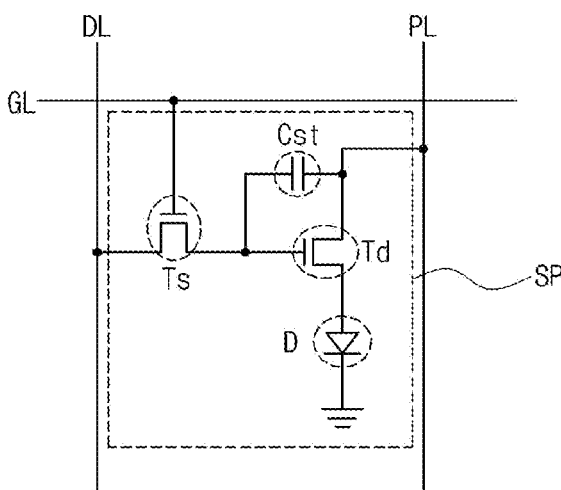
FIG. 3 is a circuit diagram conceptually illustrating the sub-pixel of an organic light emitting display apparatus according to one embodiment of the present disclosure.

FIG. 3 is the circuit diagram illustrating the sub-pixel SP of the organic light emitting display apparatus 100 according to the present invention.

As shown in FIG. 3, the organic light emitting display apparatus 100 according to one embodiment of the present invention includes the gate line GL, the data line DL, and the power line PL crossing each other for defining the sub-pixel SP. A switching thin film transistor Ts, a driving thin film transistor DT, a storage capacitor Cst, and an organic light emitting device D are disposed in the sub-pixel SP.

The switching thin film transistor Ts is connected to the gate line GL and the data line DL, and the driving thin film transistor Td and the storage capacitor Cst are connected between the switching thin film transistor Ts and the power line PL. The organic light emitting device D is connected to the driving thin film transistor Td.

In the organic light emitting display apparatus having this structure, when the switching thin film transistor Ts is turned on according to the gate signal applied to the gate line GL, the data signal applied to the data line DL is applied to the gate electrode of the driving thin film transistor Td and one electrode of the storage capacitor Cst through the switching thin film transistor Ts.

The driving thin film transistor Td is turned on according to the data signal applied to the gate electrode. As a result, the current proportional to the data signal is supplied to the organic light emitting device D from the power line PL through the driving thin film transistor Td and then the organic light emitting device D emits light with a luminance proportional to the current flowing through the driving thin film transistor Td.

At this time, the storage capacitor Cst is charged with the voltage proportional to the data signal to keep the voltage of the gate electrode of the driving thin film transistor Td constant for one frame.

In the figure, only two thin film transistors Td and Ts and one capacitor Cst are provided, but the present invention is not limited thereto. Three or more thin film transistors and two or more capacitors may be provided in the present invention.

Figure 4:
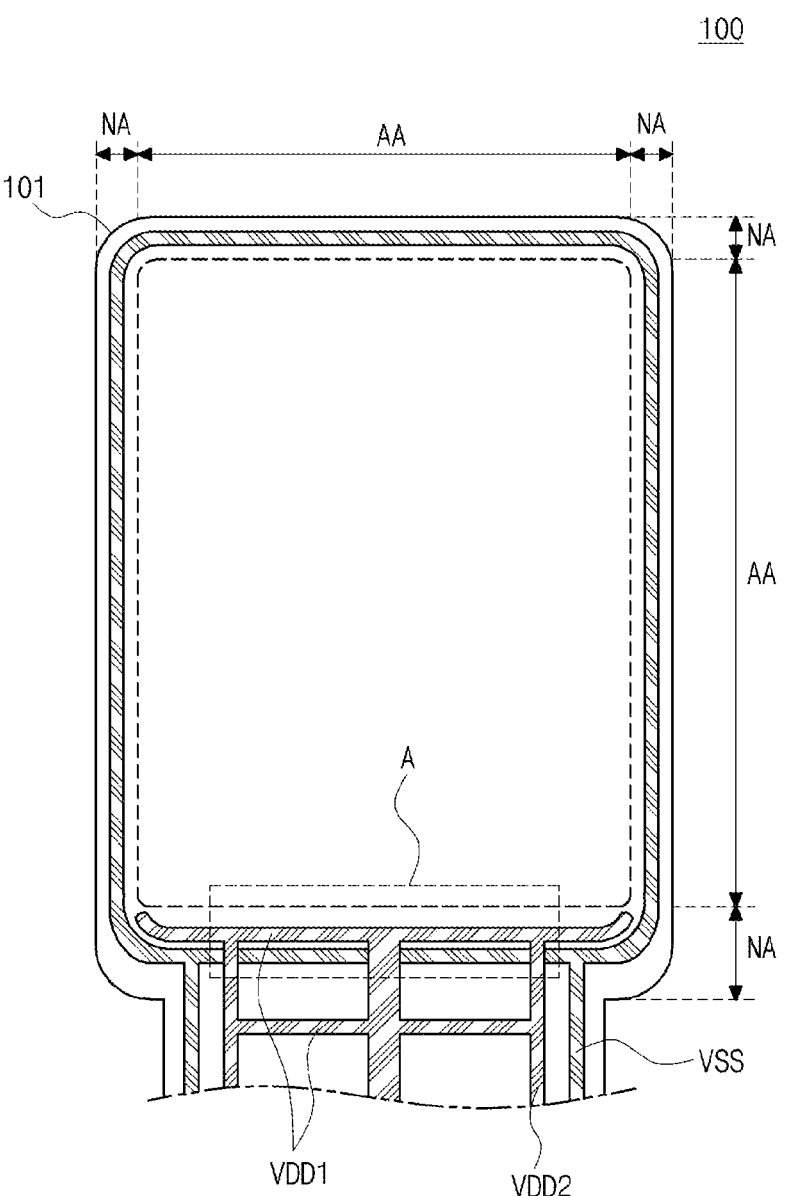
FIG. 4 is a plan view schematically illustrating the display apparatus according to one embodiment of the present disclosure.

FIG. 4 is a plan view schematically illustrating the display apparatus 100 according to the first embodiment of the present invention. In general, various signal lines are disposed in the display apparatus 100, but only the high potential voltage line VDD and the low potential voltage line VSS are shown in the drawings for convenience of description.

As shown in FIG. 4, the display apparatus 100 according to the first embodiment of the disclosure includes a display area AA in which the image is displayed and a non-display area NA formed outside the display area AA.

The display area AA is the area in which the actual image is displayed and a plurality of sub-pixels are arranged in a matrix shape in the display area AA.

The non-display area NA is formed outside the display area AA, and various driving devices and wires for applying the signal to the display area AA are disposed in the non-display area NA. The non-display areas NA are disposed in a lower region, an upper region, and both side regions to surround the outside of the display area AA.

A plurality of thin film transistors and an organic light emitting device are disposed in each of sub-pixels of the display area AA and the various lines for applying the various signals to the thin film transistors and the organic light emitting device are disposed in the non-display area NA.

The non-display area AA in the lower portion of the display area AA may be a pad area. In the pad area, a pad electrically connected to the outer region may be formed. For example, one end of a flexible circuit board such as a FPC (flexible printed circuit) or TCP (tape carrier package) may be electrically connected to the pad so that the various signals may be applied to the display apparatus from the outer region.

The low potential voltage line VSS and the high potential voltage line VDD may be disposed in the non-display area NA. The high potential voltage line VDD may supply the high potential voltage to the organic light emitting device through a first electrode in each sub-pixel of the display area AA, i.e., is, an anode electrode, and the power line.

The low potential voltage line VSS is a common line to apply the potential voltage to the second electrode, i.e., a cathode electrode.

The low potential voltage line VSS may be disposed in the entire area of the non-display area NA. That is, the low potential voltage line VSS may be extended to the left region, the right region, and the upper region of the display area AA from the pad in the pad region that is non-display area at a lower region of the display area AA. The low potential voltage lines VSS are integrally formed in the predetermined width to surround the display area in the closed curve. It is not limited thereto, and the low potential voltage lines VSS may be disposed only in the lower portion of the display area AA and in the left and right non-display areas NA.

The high potential voltage line VDD may be disposed in the pad region of the non-display area NA. That is, the high potential voltage line VDD may be arranged to surround the lower end region of the display area AA. The high potential voltage line VDD may include a first high potential voltage line VDD1 arranged horizontally with the lower end portion of the display area AA and a second high potential voltage line VDD2 arranged vertically with the lower end portion of the display area AA.

The first high potential voltage line VDD1 including a plurality of lines may be arranged in the horizontal direction near the display area AA, and a second high potential voltage line VDD2 may be arranged vertically with the first high potential voltage line VDD1. One end of the second high potential voltage line VDD2 is electrically connected to the first high potential voltage line VDD1 and the other end of the second high potential voltage line VDD2 may be connected to the pad so that the high potential voltage supplied from the outside is applied to an organic light emitting device of the display area AA.

When the corner area of the display area AA is formed in a heteromorphic shape, the first high potential voltage line VDD1 may have a heterogeneous shape corresponding to the shape of the corner area of the display area AA. That is, as shown in FIG. 4, when the corner area of the display area AA has a round shape, the width of the corner area having the heteromorphic shape of the first high potential voltage line VDD1 may be smaller than that in the central region of the first high potential voltage line VDD1.

In the non-display area NA, the first high potential voltage line VDD1 may be disposed between the low potential voltage line VSS and the display area AA. In the figure, the first high-potential voltage line VDD1 includes two parallel lines and the low potential voltage line VSS is disposed between the two first high potential voltage lines VDD1. However, the arrangement of the first high potential voltage line VDD1 and the low potential voltage line VSS is not limited to this arrangement.

Further, although two first high potential voltage lines VDD1 are horizontally arranged in the figure, it is not limited thereto, and only one high potential voltage line may be horizontally arranged and three or more high potential voltage lines may be horizontally arranged.

Figure 5:
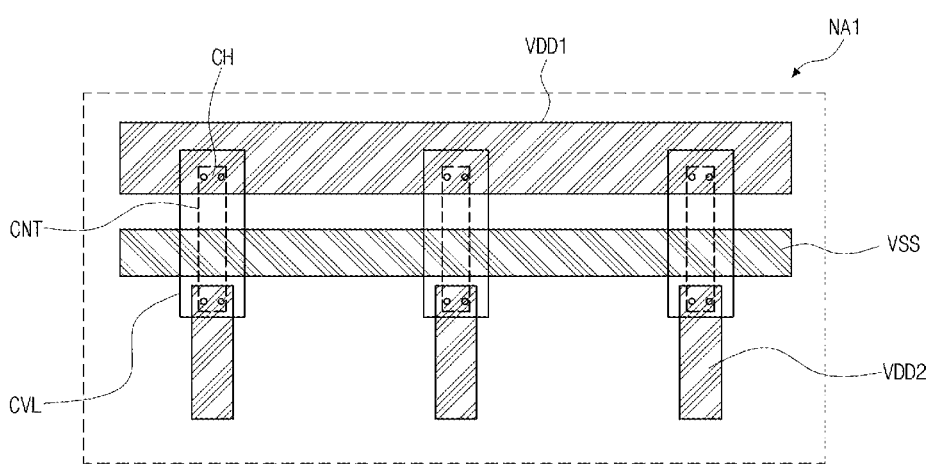
FIG. 5 is an enlarged view of the A-portion of FIG. 4 according to one embodiment of the present disclosure.

FIG. 5 is an enlarged plan view of area A of FIG. 4, showing the detailed arrangement relationship between the low potential voltage line VSS and the first high potential voltage line VDD1 disposed in the non-display area NA at the low end portion of the display area AA.

As shown in FIG. 5, in the non-display area NA, the first high potential voltage line VDD1 and the low potential voltage line VSS are arranged in parallel in the horizontal direction and the second high potential voltage line VDD2 is arranged in the vertical direction. At this time, since the low potential voltage line VSS is disposed between the first high potential voltage line VDD1 and the second high potential voltage line VDD2, the first high potential voltage line VDD1 and the second high potential voltage line (VDD2) are spaced apart from each other by a predetermined distance. That is, the first high potential voltage line VDD1 and the second high potential voltage line VDD2 are electrically separated by the low potential voltage line VSS.

The low potential voltage line VDD1 and the second high potential voltage line VDD2 which are electrically disconnected may be electrically connected by a connection line CNT. The connection line CNT may be made of metal, but is not limited thereto and may be made of various materials having high electrical conductivity. The connection line CNT, the first high potential voltage line VDD1 and the second high potential voltage line VDD2 are formed on different layers. For example, the connection line CNT, the first high potential voltage line VDD1 and the second high potential voltage line VDD2 may be disposed with an insulating layer interposed therebetween.

A contact hole CH is formed in the insulating layer of the region corresponding to both ends of the connection line CNT, and the first high potential voltage line VDD1 and the second high potential voltage line VDD2 are connected to the connection line CNT through the contact hole CH, so that the first high potential voltage line VDD1 is electrically connected to the second high potential voltage line VDD2 by the connection line CNT.

A cover layer CVL may be formed on the connection line CNT. The cover layer CVL protects the connection line CNT from impact from the outside or blocks moisture penetration into the connection line CNT from the outside. Although described in detail later, the cover layer CVL may be composed of a single inorganic layer such as SiNx or SiOx or may be composed of two or more inorganic layers, but is not limited thereto.

The cover layer CVL may be formed with an area larger than that of the connection line CNT to completely cover the connection line CNT, but is not limited thereto.

On the other hand, the contact hole CH for electrically connecting the first high potential voltage line VDD1 and the second high potential voltage line VDD2 through the connection line CNT may be formed in various numbers in the insulating layer.

Figure 6A:
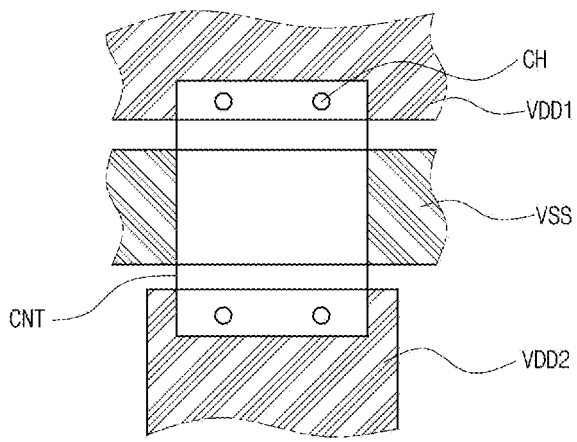
FIGS. 6A to 6C are views illustrating the shape of the contact hole formed in the insulating layer under the connection line according to one embodiment of the present disclosure.
Figure 6B:
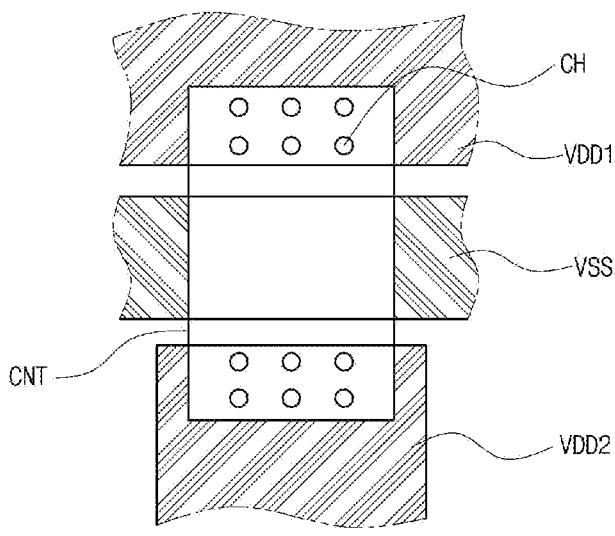
Figure 6C:
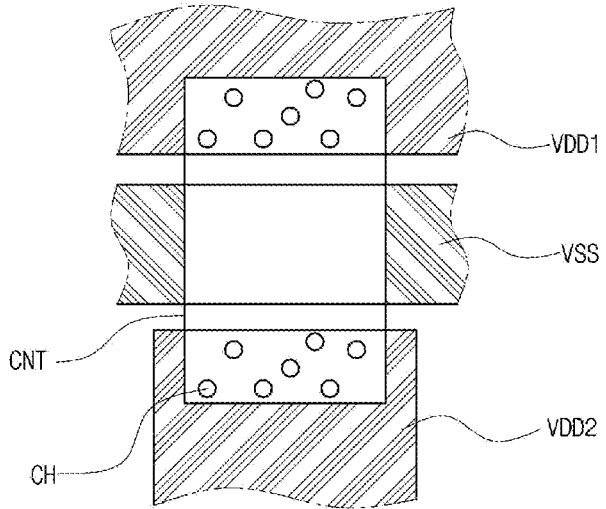

FIGS. 6A to 6C are views illustrating the shape of the contact hole CH formed in the insulating layer under the connection line CNT.

As shown in FIGS. 6A to 6C, the low potential voltage line VSS is disposed between the first high potential voltage line VDD1 and the second high potential voltage line VDD2, and the first high potential voltage line VDD1 and the second high potential voltage line VDD2 are electrically connected by the connection line CNT.

At this time, the connection line CNT is formed with the insulating layer interposed between the first high potential voltage line VDD1 and the second high potential voltage line VDD2. The connection line CNT is electrically connected to the first high potential voltage line VDD1 and the second high potential voltage line VDD2 through the contact hole CH formed in the insulating layer, so that the first high potential voltage line VDD1 and the second high potential voltage line VDD2 are electrically connected through the connection line CNT.

Since the connection line CNT transfers the high potential voltage input from the outside to the second high potential voltage line VDD2 to the first high potential voltage line VDD1 through the pad, the resistance should be minimized. Therefore, the connection line CNT may be formed of the metal having the high electrical conductivity for low resistance.

Further, as shown in FIG. 6A, a plurality of contact holes CH may be formed in a row in the insulating layer respectively corresponding to the first high potential voltage line VDD1 and the second high potential voltage line VDD2 in order to minimize a contact resistance between the connection line CNT and first and second high potential voltage lines VDD1 and VDD2.

Further, as shown in FIG. 6B, a plurality of contact holes CH may be formed in a plurality of rows in the insulating layer respectively corresponding to the first high potential voltage line VDD1 and the second high potential voltage line VDD2.

In addition, as shown in FIG. 6C, a plurality of contact holes CH may be formed in a zigzag shape in the insulating layer respectively corresponding to the first high potential voltage line VDD1 and the second high potential voltage line VDD2.

However, the contact hole CH is not limited to this configuration. The number of the contact holes CH or the arrangement of a plurality of the contact holes CH may be dependent upon the shape or size of the connection line CNT and the overlapping shape or area of the connection line CNT and the first and second high potential voltage lines VDD1 and VDD2.

Hereinafter, the invention will be described in more detail with reference to cross-sectional view showing the structure of the display apparatus 100 in detail.

Figure 7:
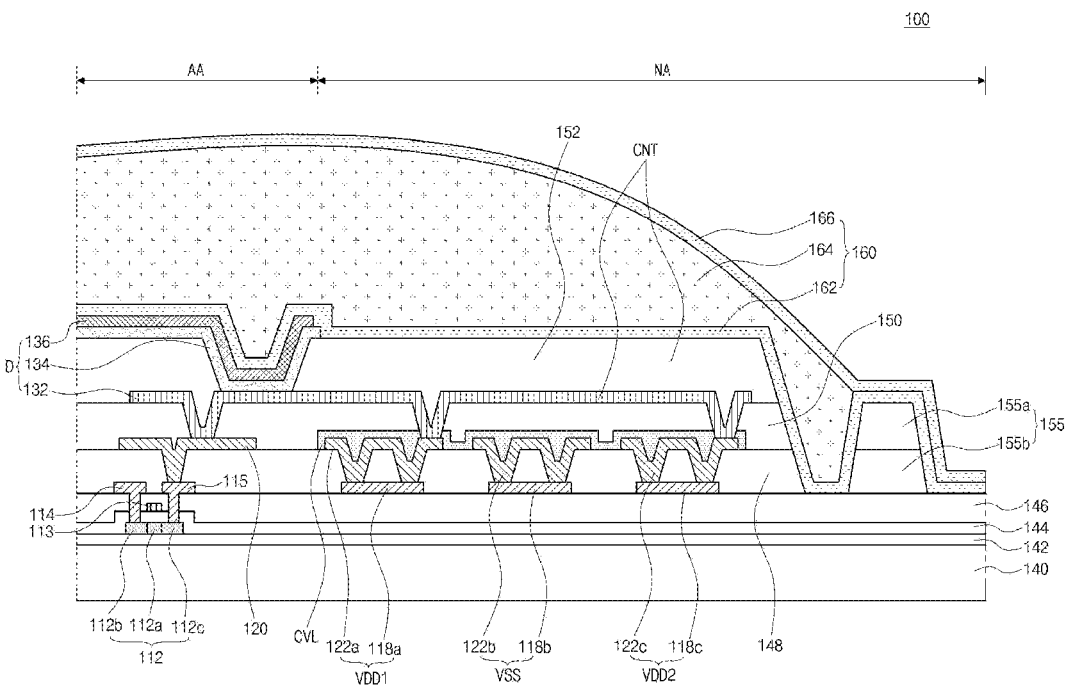
FIG. 7 is a cross-sectional view illustration the structure of the display apparatus according to one embodiment of the present disclosure.

FIG. 7 is a cross-sectional view showing the structure of the display apparatus 100 according to the invention. Although a plurality of thin film transistors and various lines are disposed in the display area AA and the non-display area NA, only one thin film transistor disposed in the display area AA and the low potential voltage line VSS and the high potential voltage lines VDD1 and VDD2 disposed in the non-display area shown in the figure for convenience of explanation.

As shown in FIG. 7, a first buffer layer 142 is formed on a substrate 140. The substrate 140 may be made of a hard material such as a glass or a plastic material, but not limited thereto. For example, the plastic material may include a polyimide, a polymethylmethacrylate, a polyethylene terephthalate, a Polyethersulfone, and a Polycarbonate.

When the substrate 140 is made of polyimide, the substrate 140 may be made of a plurality of polyimide layers, and an inorganic layer may be further disposed between the polyimide layers, but is not limited thereto.

The buffer layer 142 may be formed in the entire area of the substrate 140 to enhance adhering force between the substrate 140 and the layers thereon. Further, the buffer layer 142 may block various types of defects, such as alkali components flowing out from the substrate 140. In addition, the buffer layer 142 may delay diffusion of moisture or oxygen penetrating into the substrate 140.

The first buffer layer 142 may be a single layer made of silicon oxide (SiOx) or silicon nitride (SiNx), or multi-layers thereof. When the buffer layer 142 is made of multiple layers, SiOx and SiNx may be alternately formed. The buffer layer 142 may be omitted based on the type and material of the substrate 140, the structure and type of the thin film transistor, and the like.

A thin film transistor is formed on the buffer layer 142 in the display area AA. For convenience of description, only the driving thin film transistor among various thin film transistors that may be disposed in the display area AA is illustrated, but other thin film transistors such as switching thin film transistors may also be included. In the figure, the thin film transistor of a top gate structure is shown, but the thin film transistor is not limited to this structure and may be formed in other structures such as the thin film transistor of a bottom gate structure.

The thin film transistor includes a semiconductor pattern 112 disposed on the buffer layer 142, a gate insulating layer 144 covering the semiconductor pattern 112, a gate electrode 113 on the gate insulating layer 144, an interlayer insulating layer 146 covering the gate electrode 113, and a source electrode 114 and a drain electrode 115 on the interlayer insulating layer 146.

The semiconductor pattern 112 may be made of a polycrystalline semiconductor. For example, the polycrystalline semiconductor may be made of low temperature poly silicon (LTPS) having high mobility, but is not limited thereto.

The semiconductor pattern 112 may be made of an oxide semiconductor. For example, semiconductor pattern 112 may be made of one of IGZO (Indium-gallium-zinc-oxide), IZO (Indium-zinc-oxide), IGTO (Indium-gallium-tin-oxide), and IGO (Indium-gallium-oxide), but is not limited thereto. The semiconductor pattern 112 includes a channel region 112*a* in a central region and a source region 112*b* and a drain region 112*c* which are doped layers at the both sides of the channel region 112*a*.

The gate insulating layer 144 may be formed in the display area AA and the non-display area NA or formed only in the display area AA. The gate insulating layer 144 may be composed of a single layer or multiple layers made of an inorganic material such as SiOx or SiNx, but is not limited thereto.

The gate electrode 113 is made of metal. For example, the gate electrode 113 may be formed of the single layer or multi layers made of one or alloys of molybdenum (Mo), aluminum (Al), chromium (Cr), gold (Au), titanium (Ti), nickel (Ni), neodymium (Nd), and copper (Cu), but is not limited thereto.

The interlayer insulating layer 146 may be formed in the display area AA and the non-display area NA or formed only in the display area AA. The interlayer insulating layer 146 may be made of the organic material such as photo-acryl, or the interlayer insulating layer 146 may formed of a single layer or multiple layers made of inorganic material such as SiOx or SiNx, but is not limited thereto. Further, the interlayer insulating layer 146 may be formed of the multi layers of the organic material layer and the inorganic material layer, but is not limited thereto.

The source electrode 114 and the drain electrode 115 are formed of the single layer or multi layers made of one or alloys of molybdenum (Mo), aluminum (Al), chromium (Cr), gold (Au), titanium (Ti), nickel (Ni), neodymium (Nd), and copper (Cu), but is not limited thereto. The source electrode 114 and the drain electrode 115 may be respectively contacted to the source region 112*b* and the drain region 112*c* of the semiconductor through contact holes formed in the gate insulating layer 144 and the interlayer insulating layer 146.

Not shown in figure, a bottom shield metal layer may be disposed on the substrate 140 under the semiconductor pattern 112. The bottom shield metal layer minimizes a backchannel phenomenon caused by charges trapped in the substrate 140 to prevent afterimages or deterioration of transistor performance. The bottom shield metal layer may be composed of a single layer or multi layers made of titanium (Ti), molybdenum (Mo), or an alloy thereof, but is not limited thereto.

A first insulating layer 148 is formed on the substrate where the thin film transistor is disposed. The first insulating layer 148 may be formed in the display area AA and the non-display area NA or formed only in the display area AA. The first insulating layer 148 may be formed of organic material such as photo acrylic. But it is not limited thereto. The first insulating layer 148 may include a plurality of layers including the inorganic layer and the organic layer.

A connection electrode 120 may be formed inside or on the first insulating layer 148. The connection electrode 120 is made of one or alloys of molybdenum (Mo), aluminum (Al), chromium (Cr), gold (Au), titanium (Ti), nickel (Ni), neodymium (Nd), and copper (Cu). Further, the connection electrode 120 may be formed of a single layer or multi layers made of a metal oxide material such as ITO (Indium Tin Oxide) or IZO (Indium Zinc Oxide). However, the connection electrode 120 is not limited to these materials. The connection electrode 120 is electrically connected to the drain electrode 115 of the thin film transistor through the contact hole formed in the first insulating layer 148.

A second insulating layer 150 is formed on the connection electrode 120. The second insulating layer 150 may be formed in the display area AA and the non-display area NA or formed only in the display area AA. The second insulating layer 150 may be formed of organic material such as photo acrylic. But it is not limited thereto. The second insulating layer 150 may include a plurality of layers including the inorganic layer and the organic layer.

An organic light emitting device D is disposed on the second insulating layer 150. The organic light emitting device D includes a first electrode 132, an organic layer 134, and a second electrode 136.

The first electrode 132 is disposed on the second insulating layer 150 and electrically connected to the connection electrode 120 through the contact hole formed in the second insulating layer 150. The first electrode 132 may be formed of at least one of silver (Ag), aluminum (Al), gold (Au), molybdenum (Mo), tungsten (W), chromium (Cr), or an alloy thereof. The first electrode 132 is electrically connected to the drain electrode 115 of the thin film transistor through the connection electrode 120 to supply an image signal from the outside. Further, the first electrode 132 may be made of the transparent metal oxide layer such as indium tin oxide (ITO) or indium zinc oxide (IZO), but is not limited thereto.

When the display apparatus 100 is a top emission type display apparatus, the first electrode 132 may be a reflective electrode made of an opaque conductive material. When the display apparatus 100 is a bottom emission type display apparatus, the first electrode 132 may be made of a transparent conductive material such as ITO or IZO.

A bank layer 152 is formed at the boundary of each sub-pixel on the second insulating layer 150. The bank layer 152 partitions each sub-pixel to prevent mixing of light of a specific color output from adjacent pixels.

The bank layer 152 is made of at least one material of inorganic insulating material such as SiNx or SiOx, the organic insulating material such as BenzoCycloButene, acrylic resin, epoxy resin, phenolic resin, polyamide resin, or the photosensitizer including black pigment, but is not limited thereto.

The organic layer 134 is formed on the upper surface of the first electrode 132, the inclined surface of the bank layer 152, or the partial region of the upper surface of the bank layer 152. The organic layer 134 is formed in the R, G, and B sub-pixels and may include an R-emitting layer for emitting red light, a G-emitting layer for emitting green light, and a B-emitting layer for emitting blue light. Further, the organic layer 134 may include a W-emitting layer for emitting white light. For example, the organic layer 134 may include an organic light emitting layer, an inorganic light emitting layer, a nano-sized material layer, a quantum dot layer, a micro LED light emitting layer, or a mini LED light emitting layer, but is not limited thereto.

The organic layer 134 may further include an electron injecting layer for injecting electrons into the light emitting layer, a hole injecting layer for injecting holes into the light emitting layer, an electron transporting layer for transporting the injected electrons to the light emitting layer, a hole transporting layer for transporting the injected holes to the light emitting layer, an electron blocking layer, and a hole blocking layer, but is not limited thereto.

The second electrode 136 is disposed on the organic layer 134 and may be formed of the single layer or the multi layers made of the metal or the alloy thereof. Further, the second electrode 136 may be made of a transparent metal oxide material such as ITO or IZO, but is not limited thereto.

When the display apparatus 100 is the top emission type, the second electrode 136 may be made of the translucent conductive material that transmits light. For example, the second electrode 136 may be made of at least one or more of the alloys such as LiF/Al, CsF/Al, Mg:Ag, Ca/Ag, Ca:Ag, LiF/Mg:Ag, LiF/Ca/Ag, or LiF/Ca:Ag.

When the display apparatus 100 is the bottom emission type, the second electrode 136 may be the reflective electrode made of the opaque conductive material. For example, the second electrode 136 may be made of at least one or more of silver (Ag), aluminum (Al), gold (Au), molybdenum (Mo), tungsten (W), chromium (Cr), or alloys thereof.

Further, the organic light emitting device D may be formed in a tandem structure. The tandem structure may include a plurality of organic light emitting layers and a charge generating layer disposed between the organic light emitting layers. The charge generating layer is disposed to adjust the charge balance between the plurality of organic light emitting layers, and may be formed of a plurality of layers including a first charge generating layer and a second charge generating layer. The charge generating layer may include an N-type charge generating layer and a P-type charge generating layer. In this case, the charge generating layer may be formed of the organic layer doped with an alkali metal such as Li, Na, K, or Cs or an alkaline earth metal such as Mg, Sr, Ba, or Ra, but is not limited thereto.

In the non-display area NA, the first high potential voltage line VDD1, the low potential voltage line VSS, and the second high potential voltage line VDD2 are sequentially disposed in the horizontal direction from the display area AA. That is, the first high potential voltage line VDD1 is disposed close to the display area AA, and the low potential voltage line VSS is disposed between the first high potential voltage line VDD1 and the second high potential voltage line VDD2.

Although described in detail later, since the low potential voltage line VSS is arranged in parallel with the high potential voltage lines VDD1 and VDD2, the increase in potential difference due to the high potential voltage lines VDD1 and VDD2 can be prevented. As a result, it is possible to prevent the increase of the luminance in the area adjacent to the high potential voltage lines VDD1 and VDD2 (for example, the bottom of the screen).

The first high potential voltage line VDD1 may include a first metal layer 118a disposed on the interlayer insulating layer 146 and a second metal layer 122a disposed on the first insulating layer 148. The low potential voltage line VSS may include a third metal layer 118b disposed on the interlayer insulating layer 146 and a fourth metal layer 122b disposed on the first insulating layer 148. The second high potential voltage line VDD2 may include a fifth metal layer 118c disposed on the interlayer insulating layer 146 and a sixth metal layer 122c disposed on the first insulating layer 148.

The first metal layer 118a, the third metal layer 118b, and the fifth metal layer 118c may be made of the same metal in the same process as the source electrode 114 and the drain electrode 115 of the thin film transistor. However, it is not limited thereto, and the first metal layer 118a, the third metal layer 118b, and the fifth metal layer 118c may be made of different metals in different processes from that of the source electrode 114 and the drain electrode 115 of the thin film transistor.

The second metal layer 122a, the fourth metal layer 122b, and the sixth metal layer 122c may b made of the same metal in the same process as the connection electrode 120. However, it is not limited thereto, and the second metal layer 122a, the fourth metal layer 122b, and the sixth metal layer 122c may be made of different metals in different processes from that of the connection electrode 120.

The first metal layer 118a may be electrically connected to the second metal layer 122a through the contact hole formed in the first insulating layer 148. The third metal layer 118b may be electrically connected to the fourth metal layer 122b through the contact hole formed in the first insulating layer 148. The fifth metal layer 118c may be electrically connected to the sixth metal layer 122c through the contact hole formed in the first insulating layer 148.

In the figure, two contact holes are respectively formed in the first insulating layer 148 corresponding to the first metal layer 118a, the third metal layer 118b, and the fifth metal layer 118c, but one contact hole may be formed and three or more contact holes may be formed as shown in FIGS. 6A to 6C.

In the figure, the first high potential voltage line VDD1, the second high potential voltage line VDD2, and the low potential voltage line VSS are formed of two metal layers, but the first high potential voltage line VDD1, the second high potential voltage line VDD2, and the low potential voltage line VSS may be formed of one metal layer and three or more metal layers. Further, the first high potential voltage line VDD1, the second high potential voltage line VDD2, and the low potential voltage line VSS may have different numbers of layers.

For example, when the first insulating layer 148 is formed of two layers, for example, a lower inorganic layer and an upper organic layer, an additional metal layer may be respectively disposed on the lower inorganic layer and the upper organic layer, the first high potential voltage line VDD1, the second high potential voltage line VDD2, and the low potential voltage line VSS may be formed of three metal layers.

As described above, the first high potential voltage line VDD1, the second high potential voltage line VDD2, and the low potential voltage line VSS may be formed of the various number and shapes depending on the structure of the display apparatus 100, for example, the structure of the layers.

A cover layer CVL may be formed on the first high potential voltage line VDD1, the second high potential voltage line VDD2, and the low potential voltage line VSS disposed in the non-display area NA. The cover layer CVL, which is the insulating layer, covers the first high potential voltage line VDD1, the second high potential voltage line VDD2, and the low potential voltage line VSS to protect the first high potential voltage line VDD1, the second high potential voltage line VDD2, and the low potential voltage line VSS from the external impact, and blocks moisture, oxygen, or the like from the outside into the first high potential voltage line VDD1, the second high potential voltage line VDD2, and the low-potential voltage line VSS.

Although the cover layer CVL is formed only on the first high potential voltage line VDD1, the second high potential voltage line VDD2, and the low potential voltage line VSS of the non-display area NA in the figure, the cover layer CVL may be formed over the entire area of the display area AA and the non-display area NA on the first insulating layer 148 to cover the first high potential voltage line VDD1, the second high potential voltage line VDD2, and the low potential voltage line VSS.

The cover layer CVL may be made of inorganic material such as SiOx or Sinx, but is not limited thereto.

Referring to FIG. 7, an encapsulating layer 160 is formed on the organic light emitting device D. When the organic light emitting device D is exposed to impurities such as moisture or oxygen, a pixel shrinkage phenomenon in which the light emitting area is reduced or the defect such as a dark spot in the light emitting area may occur. Further, moisture or oxygen penetrating into the organic light emitting device D oxidizes the metal electrode. The encapsulating layer 160 blocks impurities such as oxygen and moisture from the outside to prevent defects of the organic light emitting device D and various electrodes.

The encapsulating layer 160 may be formed of a first encapsulating layer 162, a second encapsulating layer 164, and a third encapsulating layer 166, but is not limited thereto. The encapsulating layer 160 may be formed of two layers or four or more layers.

The first encapsulating layer 162 and the third encapsulating layer 166 may be made of inorganic material such as SiOx or SiNx, but are not limited thereto. The second encapsulating layer 164 may be made of organic insulating material such as acrylic resin, epoxy resin, polyimide, polyethylene, or silicon oxycarbon (SiOC), but is not limited thereto.

The first encapsulating layer 162 and the third encapsulating layer 166 made of inorganic material block the permeation of the impurities such as moisture or oxygen, and the second encapsulating layer 164 made of organic material flattens the surface of the display apparatus and prevents the cracks in the encapsulation layer 160 by an external force.

A dam 155 is formed outside the non-display area NA. Since the organic material forming the second encapsulation layer 164 has fluidity, the organic material may flow out to the outside of the substrate 140 by the fluidity when the second encapsulation layer 164 is formed.

Since the dam 155 is formed to surround the display area NA, the organic materials flowing out of the substrate 140 may be contained by the dam 155 when the second encapsulation layer 164 is formed. Therefore, the organic material does not flow out of the substrate 140.

Thus, the dam 155 may be formed at various heights according to the structure of the display apparatus 100, for example, the thickness of the second encapsulating layer 164. The dam 155 may be formed in two layers 155a and 155b. In this case, the lower first dam 155a may be made of the same material by the same process as the first insulating layer 148, and the upper second dam 155a may be made of the same material by the same process as the second insulating layer 150.

The dam 155 may have three layers. In this case, the uppermost dam may be made of the same material by the same process as the bank layer 152.

Although one dam 155 is formed in the figure, a plurality of dams 155 may be formed. At this time, the plurality of dams 155 may be spaced apart by the predetermined distance.

As described above, in the display apparatus 100 according to an embodiment of the invention, the low potential voltage line VSS and the first high potential voltage line VDD1 are arranged in parallel in the non-display area NA, that is, the area to which the voltage is applied at the lower end portion of the display area AA, so that the non-uniform luminance by the abnormal increase in the luminance at the lower end portion of the display area AA may be prevented. Hereinafter, this will be described in detail.

Figure 8A:
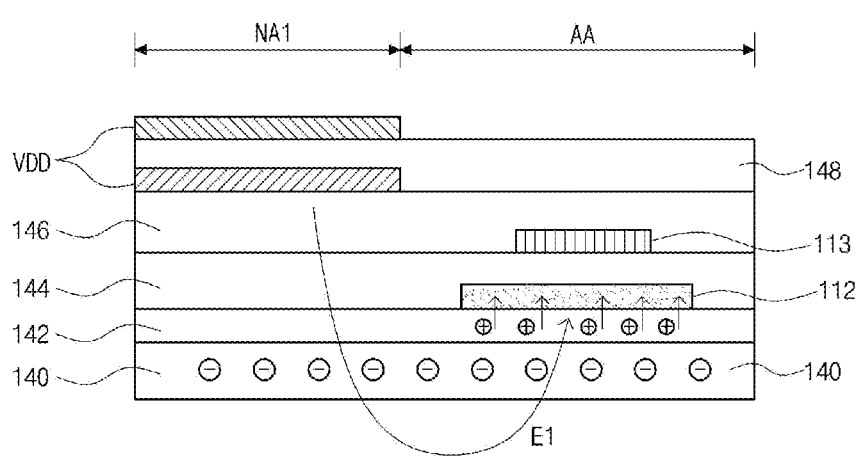
FIG. 8A is the view showing the structure in which the high potential voltage line and the low potential voltage line are not disposed in parallel in a non-display area according to one embodiment of present disclosure.
Figure 8B:
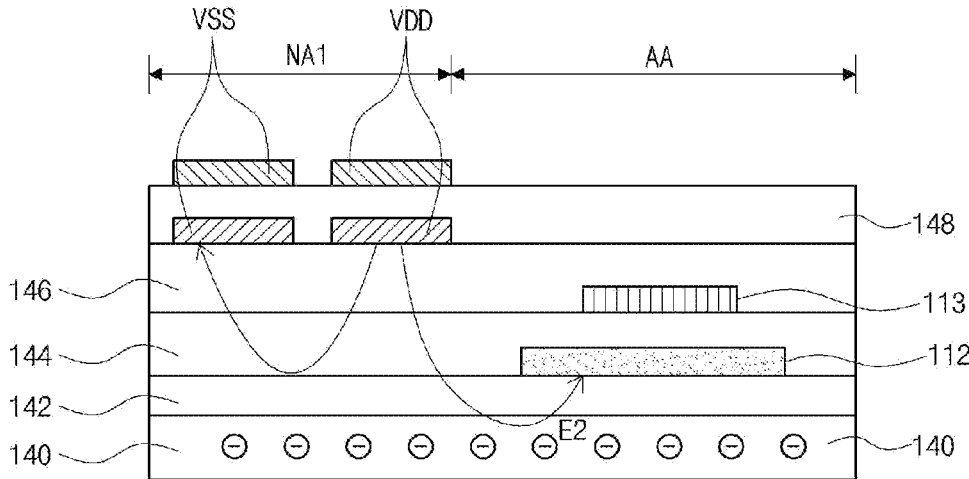
FIG. 8B is a view showing the structure in which the high potential voltage line and a low potential voltage line are disposed in parallel according to one embodiment of present disclosure.

FIGS. 8A and 8B are partial cross-sectional views conceptually illustrating prevention of the non-uniformity of the luminance in the non-display area NA1 of the display apparatus 100, respectively. FIG. 8A is the view showing the structure in which the high potential voltage line VDD1 and the low potential voltage line VSS are not disposed in parallel in a non-display area NA, and FIG. 8B is the view showing the structure in which the high potential voltage line VDD1 and a low potential voltage line VSS are disposed in parallel.

In order to manufacture the high brightness display apparatus, a tandem structure in which a plurality of organic light emitting devices are stacked in series has recently been proposed. In this tandem structure, a relatively high voltage is applied to drive a plurality of organic light emitting devices connected in series.

As shown in FIG. 8A, only the high potential voltage line VDD is disposed in the lower end portion of the display area AA, the electric field E1 is formed between the high potential voltage line VDD and the lines of the display area AA, so that the charges are stored in the substrate 140 made of the organic material such as the polyimide by the electric field E1.

The charges are induced in the lower portion of the semiconductor pattern 112 in the display area AA by the charges stored by the electric field E1, and the induced charges act as a positive bias voltage of the thin film transistor so that the threshold voltage of the thin film transistor is varied to negative. This variation of the threshold voltage causes a leakage current and the luminance at the low gray level is increased by the leakage current.

Figure 9:
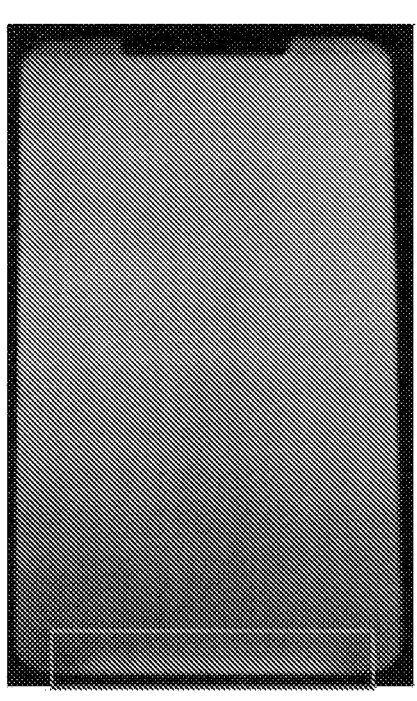
FIG. 9 is a view showing that luminance non-uniformity occurs in a low end portion of display area in a structure in which high potential voltage lines and low potential voltage lines are not disposed in a non-display area at the lower end portion of a display area according to one embodiment of the present disclosure.

The induction of the charge by the electric field E1 is most severe in the non-display area NA, that is, the pad area, at the lower end portion of the display area AA where the high potential voltage line VDD is disposed, and the induction of the charge is decreased as moving away from the lower end portion of the display area AA. Therefore, as shown in FIG. 9, the increase of the luminance due to the leakage current mainly occurs at the lower end portion of the display area AA adjacent to the non-display area NA1.

As shown in FIG. 8B, since the high potential voltage line VDD is disposed between the low potential voltage line VSS and the display area AA in the display apparatus according to the invention, the electric field E2 is formed between the high potential voltage line VDD and the lines of the display area AA and the electric field E3 is also formed between the high potential voltage line VDD and the low potential voltage line VSS.

In the display apparatus according to the invention, therefore, the electric field caused by the high voltage of the high potential voltage line VDD is dispersed by the lines of the display area AA and the low potential voltage line VSS, so that the intensity of the electric field E2 between the high potential voltage line VDD and the lines of the display area AA is smaller than that of the electric field E1 between the high potential voltage line VDD and the lines of the display area AA of the structure shown in FIG. 8A (E2<E1).

As the intensity of the electric field E2 decreases, the amount of charge induced to the display area AA also decreases, so that the variation of the threshold voltage of the thin film transistor does not occur or is insignificant. As a result, it is possible to effectively prevent the luminance non-uniformity caused by an increase of the luminance at the low end portion of the display area AA due to leakage current.

The above description and the accompanying drawings are merely illustrative of the technical spirit of the present invention, and those of ordinary skill in the art to which the present invention pertains can combine configurations within a range that does not depart from the essential characteristics of the present invention, various modifications or variations such as separation, substitution and alteration will be possible. Therefore, the embodiments disclosed in the present invention are not intended to limit the technical spirit of the present invention, but to explain, and the scope of the technical spirit of the present invention is not limited by these embodiments.

What is claimed is:

1. A display apparatus comprising:
a display panel having a display area configured to display an image and a non-display area around the display area;
a low potential voltage line in the non-display area;
a high potential voltage line including a first high potential voltage line between the display area and the low potential voltage line and a second high potential voltage line disposed spaced apart from the first high potential voltage line, the low potential voltage line being disposed between the first high potential voltage line and the second high potential voltage line;

a connection line for connecting electrically the first high potential voltage line and the second high potential voltage line; and
a cover layer on the connection line to cover the connection line.

2. The display apparatus of claim 1, wherein the display panel includes:
a thin film transistor, the thin film transistor comprising:
a semiconductor pattern on a substrate in the display area,
a gate insulating layer on the semiconductor pattern,
a gate electrode on the gate insulating layer,
an interlayer insulating layer on the gate electrode, and
a source electrode and a drain electrode on the interlayer insulating layer; and
a light emitting device over the thin film transistor.

3. The display apparatus of claim 2, wherein the high potential voltage line includes a first metal layer on the interlayer insulating layer.

4. The display apparatus of claim 2, wherein the high potential voltage line includes a first metal layer on the interlayer insulating layer and the low potential voltage line includes a second metal layer on the interlayer insulating layer.

5. The display apparatus of claim 4, further comprising:
an insulating layer over the thin film transistor; and
a connection layer on the insulating layer, the connection layer connecting the drain electrode of the thin film transistor to the light emitting device.

6. The display apparatus of claim 5, wherein the high potential voltage line further includes a third metal layer on the insulating layer and the low potential voltage line further includes a fourth metal layer on the insulating layer.

7. The display apparatus of claim 6, wherein the first metal layer is electrically connected to the third metal layer and the second metal layer is electrically connected to the fourth metal layer.

8. The display apparatus of claim 2, further comprising an insulating layer formed on the high potential voltage line and the low potential voltage line.

9. The display apparatus of claim 8, wherein the insulating layer is formed in an entire area of the substrate.

10. The display apparatus of claim 8, wherein the insulating layer comprises an inorganic insulating material.

11. The display apparatus of claim 1, wherein the cover layer is formed only on a upper surface and side surfaces of the connection line.

12. A display apparatus, comprising:
a display panel having a display area configured to display an image and a pad area around the display area;
a low potential voltage line in the pad area;
a high potential voltage line including a first high potential voltage line between the display area and the low potential voltage line in the pad area and a second high potential voltage line disposed spaced apart from the first high potential voltage line, the low potential voltage line being disposed between the first high potential voltage line and the second high potential voltage line;
a connection line for connecting electrically the first high potential voltage line and the second high potential voltage line; and
a cover layer on the connection line to cover the connection line.

13. The display apparatus of claim 12, wherein the pad area is disposed outside of the display area in a lower end portion of the display area.

* * * * *